US010403474B2

(12) United States Patent
Phillips et al.

(10) Patent No.: US 10,403,474 B2
(45) Date of Patent: Sep. 3, 2019

(54) COLLAR, CONICAL SHOWERHEADS AND/OR TOP PLATES FOR REDUCING RECIRCULATION IN A SUBSTRATE PROCESSING SYSTEM

(71) Applicant: Lam Research Corporation, Fremont, CA (US)

(72) Inventors: Richard Phillips, Tualatin, OR (US); Ryan Blaquiere, Portland, OR (US); Shankar Swaminathan, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 434 days.

(21) Appl. No.: 15/207,035

(22) Filed: Jul. 11, 2016

(65) Prior Publication Data
US 2018/0012733 A1    Jan. 11, 2018

(51) Int. Cl.
C23C 16/455 (2006.01)
H01J 37/32 (2006.01)
C23C 16/44 (2006.01)

(52) U.S. Cl.
CPC .... *H01J 37/32082* (2013.01); *C23C 16/4401* (2013.01); *C23C 16/45519* (2013.01); *C23C 16/45544* (2013.01); *C23C 16/45565* (2013.01); *H01J 37/3244* (2013.01); *H01J 37/32091* (2013.01); *H01J 2237/334* (2013.01)

(58) Field of Classification Search
USPC ........................ 118/715; 156/345.33, 345.34
See application file for complete search history.

(56) References Cited

U.S. PATENT DOCUMENTS

| | | | | |
|---|---|---|---|---|
| 4,825,809 | A * | 5/1989 | Mieno ................... | C23C 16/455 118/715 |
| 5,284,519 | A * | 2/1994 | Gadgil .................. | C23C 16/455 118/715 |
| 5,453,124 | A * | 9/1995 | Moslehi ............ | C23C 16/45561 118/715 |
| 5,532,190 | A * | 7/1996 | Goodyear ......... | C23C 16/45512 118/715 |
| 6,287,643 | B1 | 9/2001 | Powell et al. | |
| 6,299,692 | B1 * | 10/2001 | Ku ....................... | C23C 16/4485 118/715 |

(Continued)

FOREIGN PATENT DOCUMENTS

KR    100919538 B1    10/2009

*Primary Examiner* — Rudy Zervigon (57) ABSTRACT

A substrate processing system includes a processing chamber and a showerhead including a faceplate, a stem portion and a cylindrical base portion. A collar connects the showerhead to a top surface of the processing chamber. The collar defines a gas channel to receive secondary purge gas and a plurality of gas slits to direct the secondary purge gas from the gas channel in a radially outward and downward direction. A conical surface is arranged adjacent to the cylindrical base and around the stem portion of the showerhead. An inverted conical surface is arranged adjacent to a top surface and sidewalls of the processing chamber. The conical surface and the inverted conical surface define an angled gas channel from the plurality of gas slits to a gap defined between a radially outer portion of the cylindrical base portion and the sidewalls of the processing chamber.

10 Claims, 4 Drawing Sheets

(56) References Cited

U.S. PATENT DOCUMENTS

| | | | |
|---|---|---|---|
| 6,302,965 B1* | 10/2001 | Umotoy | C23C 16/16 118/715 |
| 6,387,182 B1* | 5/2002 | Horie | C23C 16/409 118/244 |
| 6,415,736 B1 | 7/2002 | Hao et al. | |
| 6,899,764 B2* | 5/2005 | Frijlink | C23C 16/4412 118/715 |
| 7,147,718 B2* | 12/2006 | Jurgensen | C23C 16/455 118/715 |
| 7,252,716 B2* | 8/2007 | Kim | C23C 16/4558 118/715 |
| 7,462,245 B2* | 12/2008 | Shimizu | C23C 16/4481 118/723 VE |
| 7,591,907 B2 | 9/2009 | Chen et al. | |
| 7,722,719 B2 | 5/2010 | Lei et al. | |
| 7,794,544 B2 | 9/2010 | Nguyen et al. | |
| 7,913,706 B2 | 3/2011 | DeKraker et al. | |
| 7,918,938 B2* | 4/2011 | Provencher | C23C 16/45536 118/715 |
| 8,075,690 B2* | 12/2011 | Keller | H01J 37/3244 118/715 |
| 8,100,081 B1* | 1/2012 | Henri | C23F 4/00 118/723 ER |
| 8,778,079 B2* | 7/2014 | Begarney | C23C 16/45508 118/715 |
| 9,121,097 B2 | 9/2015 | Mohn et al. | |
| 9,340,879 B2 | 5/2016 | Yahata | |
| 9,399,228 B2* | 7/2016 | Breiling | B05B 1/005 |
| 9,758,868 B1* | 9/2017 | Breiling | C23C 16/4408 |
| 10,008,367 B2* | 6/2018 | Huang | H01J 37/3244 |
| 10,023,960 B2* | 7/2018 | Alokozai | H01L 21/02274 |
| 2002/0039625 A1* | 4/2002 | Powell | C23C 16/452 427/569 |
| 2002/0108933 A1 | 8/2002 | Hoffman et al. | |
| 2003/0054099 A1* | 3/2003 | Jurgensen | C23C 14/0015 427/248.1 |
| 2004/0216844 A1* | 11/2004 | Janakiraman | C23C 16/4405 156/345.33 |
| 2005/0000441 A1* | 1/2005 | Kaeppeler | C23C 16/45568 118/723 E |
| 2005/0208217 A1 | 9/2005 | Shinriki et al. | |
| 2005/0263072 A1* | 12/2005 | Balasubramanian | C23C 16/4405 118/715 |
| 2005/0263248 A1* | 12/2005 | Rocha-Alvarez | C23C 16/4405 156/345.34 |
| 2006/0130756 A1* | 6/2006 | Liang | C23C 16/45563 118/715 |
| 2006/0196420 A1* | 9/2006 | Ushakov | C23C 16/45563 118/715 |
| 2008/0141509 A1 | 6/2008 | Nishimura | |
| 2008/0185104 A1* | 8/2008 | Brcka | H01J 37/32357 156/345.29 |
| 2008/0202416 A1 | 8/2008 | Provencher et al. | |
| 2009/0151639 A1* | 6/2009 | Kasai | C23C 16/14 118/724 |
| 2010/0288728 A1* | 11/2010 | Han | H01J 37/20 216/41 |
| 2011/0198417 A1* | 8/2011 | Detmar | H01J 37/321 239/569 |
| 2011/0226178 A1 | 9/2011 | Tsuji et al. | |
| 2013/0344245 A1* | 12/2013 | Xia | C23C 16/4401 427/255.7 |
| 2014/0217193 A1* | 8/2014 | Breiling | B05B 1/005 239/1 |
| 2014/0238608 A1* | 8/2014 | Sabri | C23C 16/505 156/345.34 |
| 2015/0167168 A1* | 6/2015 | Keshavamurthy | C23C 16/45565 438/758 |
| 2015/0187567 A1 | 7/2015 | Ashihara et al. | |
| 2016/0035566 A1* | 2/2016 | LaVoie | C23C 16/45565 438/778 |
| 2016/0079036 A1* | 3/2016 | Kang | C23C 16/509 156/345.34 |

\* cited by examiner

COLLAR, CONICAL SHOWERHEADS AND/OR TOP PLATES FOR REDUCING RECIRCULATION IN A SUBSTRATE PROCESSING SYSTEM

FIELD

The present disclosure relates to substrate processing systems, and more particularly to substrate processing systems including a collar, conical showerheads and/or top plates for reducing recirculation.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch or otherwise treat film on a substrate such as a semiconductor wafer. The substrate processing systems typically include a processing chamber, a gas distribution device such as a showerhead and a substrate support. During processing, the substrate is arranged on the substrate support. Different gas mixtures may be introduced into the processing chamber and heat or radio frequency (RF) plasma may be used during some processes to activate chemical reactions.

The processing chamber typically includes upper and lower surfaces and side walls. The showerhead typically includes a cylindrical base portion defining a gas plenum. A faceplate is arranged on one side of the gas plenum and includes a plurality of spaced through holes. The showerhead further includes a hollow stem portion that is connected at one end to an upper surface of the processing chamber and at an opposite end to a center of the cylindrical base. The stem portion of the showerhead delivers process gas to the gas plenum of the cylindrical base. The gas flows through the spaced through holes of the faceplate and is uniformly dispersed relative to a substrate arranged on a substrate support located below the showerhead.

A collar located around the stem portion may be used to deliver curtain gas to isolate adjacent processing stations with chandelier style showerheads. The collar may also be used to connect the stem portion to the upper surface of the processing chamber. The collar may include one or more gas slits that deliver secondary purge gas between the cylindrical base portion and the upper surface of the processing chamber during processing. A gap is defined between radially outer edges of the cylindrical base portion of the showerhead and the sidewalls of the processing chamber. Secondary purge gas flows through the slits on the collar and the gap and is then evacuated via an exhaust port. The symmetric configuration of the showerhead may cause recirculation of the secondary purge gas. Particles may be trapped by the recirculating gas above the showerhead during processing and may cause defects.

SUMMARY

A substrate processing system includes a processing chamber and a showerhead including a faceplate, a stem portion and a cylindrical base portion. A collar connects the showerhead to a top surface of the processing chamber. The collar defines a gas channel to receive secondary purge gas and a plurality of gas slits to direct the secondary purge gas from the gas channel in a radially outward and downward direction. A conical surface is arranged adjacent to the cylindrical base and around the stem portion of the showerhead. An inverted conical surface is arranged adjacent to a top surface and sidewalls of the processing chamber. The conical surface and the inverted conical surface define an angled gas channel from the plurality of gas slits to a gap defined between a radially outer portion of the cylindrical base portion and the sidewalls of the processing chamber.

In other features, the gas channel defines a flow path that has a constant width and that is parallel to a direction of the secondary purge gas flowing from the plurality of gas slits. The conical surface is hollow and is attached to at least one of the stem portion and the base portion of the showerhead. The conical surface is solid and is attached to at least one of the stem portion and the base portion of the showerhead.

In other features, the conical surface is integrated with at least one of the stem portion and the base portion of the showerhead. The inverted conical surface is hollow and is attached to at least one of the top surface and the sidewalls of the processing chamber. The inverted conical surface is solid and is attached to at least one of the top surface and the sidewalls of the processing chamber.

In other features, the inverted conical surface is integrated with at least one of the top surface and the sidewalls of the processing chamber. The conical surface includes a central opening for receiving the stem portion. The plurality of gas slits are spaced in radial and axial directions along the collar.

A substrate processing system includes a processing chamber and a showerhead including a faceplate, a stem portion and a cylindrical base portion. A collar connects the showerhead to a top surface of the processing chamber. The collar defines a gas channel and includes a radially inner surface, a radially outer surface and plurality of gas slits. Secondary purge gas flows from the gas channel through the gas slits in a radially outward direction. The radially inner surface defines a monotonically increasing inner diameter as an axial distance to the cylindrical base portion decreases.

In other features, the radially inner surface of the collar and the stem portion of the showerhead define a gas channel therebetween. An inverted conical surface arranged adjacent to a top surface of the processing chamber, wherein the inverted conical surface redirects the secondary purge gas flowing from the gas slits in a downwardly and outwardly direction.

In other features, a spacer is arranged around the stem portion to maintain a position of the collar relative to the stem portion. The spacer includes an annular base portion arranged adjacent to the cylindrical base portion and a plurality of arms that extend upwardly to bias the radially inner surface of the collar.

In other features, the plurality of gas slits are spaced in radial and axial directions along the collar.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Collars, conical showerheads and/or top plates according to the present disclosure are used to produce laminar gas flow between the showerhead and the top surface of the processing chamber to minimize defect-trapping recirculation regions. In some examples, the collars, conical showerheads, and/or top plates are used in conjunction with symmetric top plates in atomic layer deposition (ALD) reactors, although other types of reactors may be used.

Figure 1:
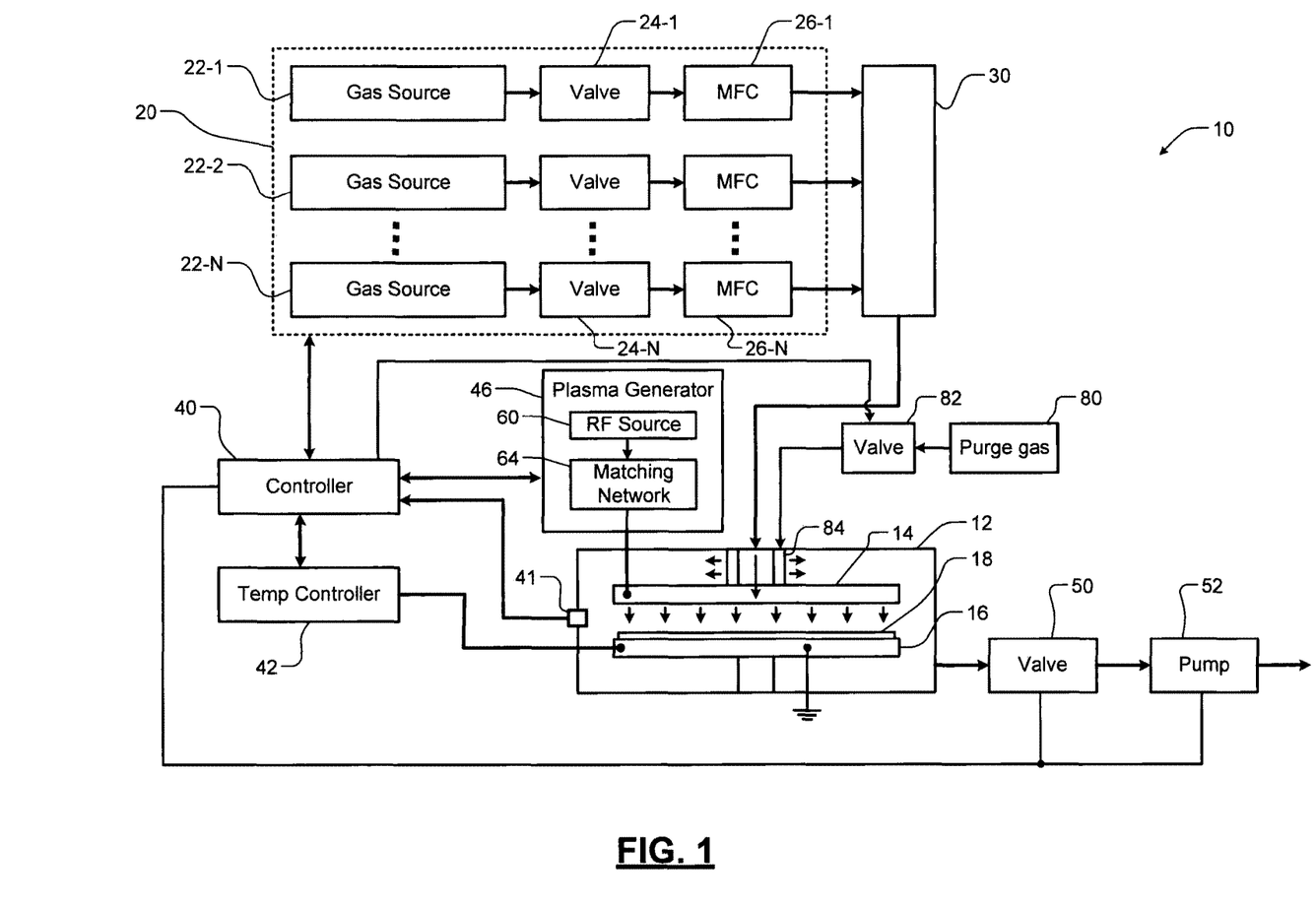
FIG. 1 is a functional block diagram of an example of a substrate processing system according to the present disclosure.

Referring now to FIG. 1, a substrate processing system 10 includes a processing chamber 12 having upper and lower surfaces and sidewalls. In some examples, the substrate processing system 10 performs ALD, although other types of substrate processing systems and/or other processes such as chemical vapor deposition (CVD), etching, etc. can be performed. A gas distribution device such as a showerhead 14 is arranged inside of the processing chamber 12. A substrate support 16 such as an electrostatic chuck, a pedestal or other substrate support is arranged below the showerhead 14. A substrate 18 is arranged on the substrate support 16 during processing.

The substrate processing system 10 further includes a gas delivery system 20 including one or more gas sources 22-1, 22-2, . . . and 22-N (collectively gas sources 22), where N is an integer greater than zero. One or more valves 24-1, 24-2, . . . and 24-N and mass flow controllers 26-1, 26-2, . . . and 26-N may be used to control flow of gas and gas flow rates from the gas sources 22 to a manifold 30. An output of the manifold 30 is in fluid communication with the showerhead 14.

A controller 40 and/or a temperature controller 42 may be used to control a temperature of the substrate support 16. The controller 40 and/or temperature controller 42 may perform heating and/or cooling. The substrate support 16 may include one or more resistive heaters, fluid channels, thermoelectric devices (TEDs) or other devices that control heating and/or cooling in one or more zones of the substrate support 16. One or more sensors 41 such as temperature and/or pressure sensors may be used to sense temperature and/or pressure values of the substrate 18, the substrate support 16, or inside or outside surfaces of the processing chamber 12. The controller 40 receives outputs of the sensors 41 and controls process operating parameters based thereon. The controller 40 also controls the gas delivery system 20 to supply process and/or purge gases at predetermined intervals during a process.

The controller 40 selectively causes the plasma generator 46 to generate plasma within the processing chamber 12 and to extinguish the plasma. The controller 40 controls an optional valve 50 and a pump 52 to control pressure within the processing chamber 12 and/or to remove reactants from the processing chamber 12. In some examples, the pump 52 may include a turbomolecular pump.

The plasma generator 46 includes an RF source 60 that supplies RF power and a matching network 64 that matches an impedance of the RF source 60 with an output of the plasma generator 46. In some examples, the plasma generator 46 outputs the RF power to the showerhead 14 and an electrode (not shown) in the substrate support 16 is grounded. In other examples, the showerhead 14 is grounded and the RF power is output to the electrode of the substrate support 16. The controller 40 communicates with the plasma generator 46 and controls the operation of the plasma generator 46 including striking and extinguishing the plasma. A purge gas source 80 and a valve 82 may be used by the controller 40 to selectively supply secondary purge gas to a collar 84, as will be described further below.

Figure 2:
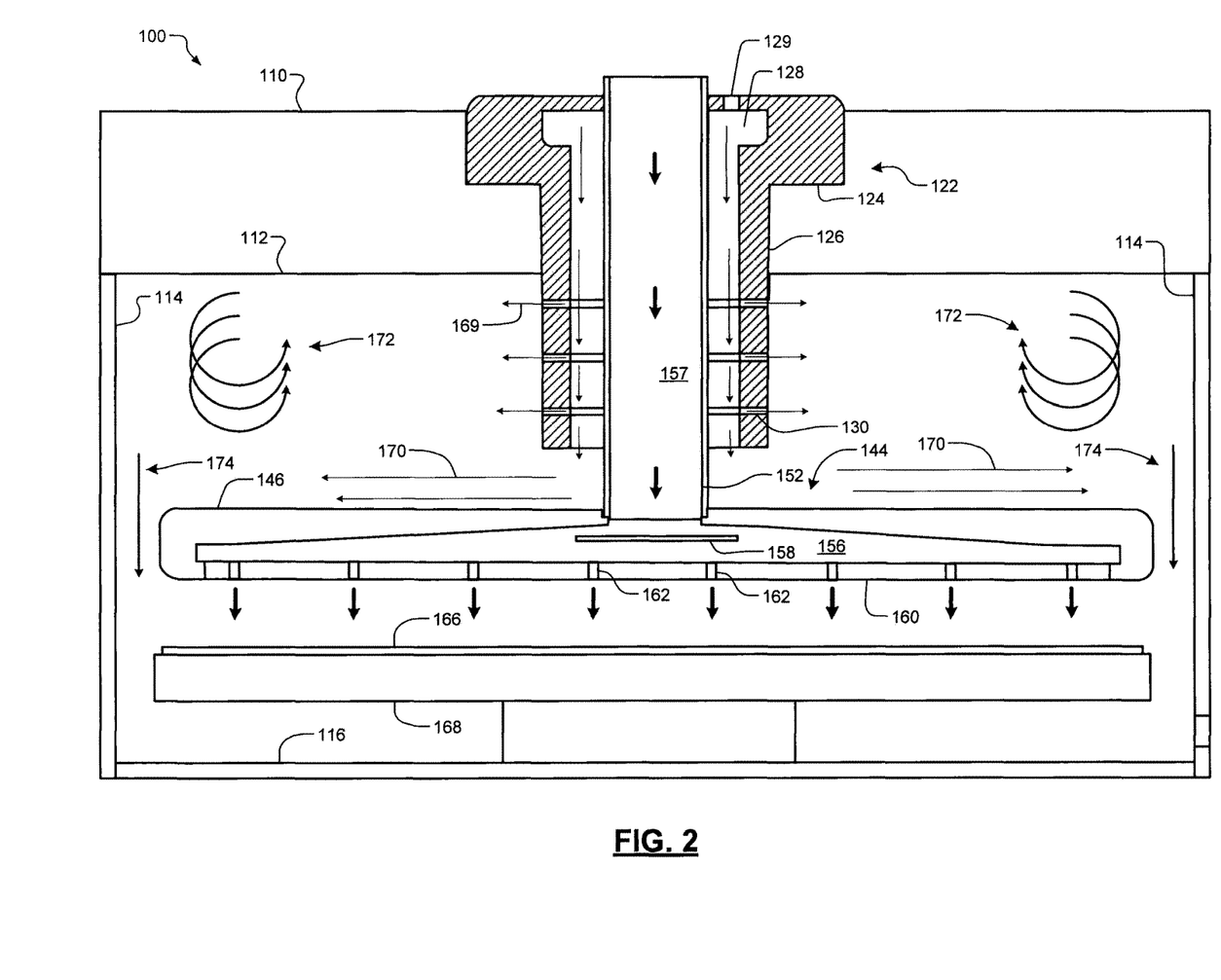
FIG. 2 is a side cross-sectional view of an example of a substrate processing system.

Referring now to FIG. 2, a substrate processing system 100 includes a processing chamber 110 with an upper surface 112, sidewalls 114 and a bottom surface 116. A collar 122 includes a base portion 124 and a stem portion 126 that extends downwardly from the base portion 124. The collar 122 defines a gas channel 128. In some examples, the gas channel is defined between the collar 122 and the stem portion of the showerhead. In other examples, the collar 122 solely defines the gas channel. In some examples, the gas channel 128 is annular-shaped. An inlet 129 may be used to connect a gas source such as secondary purge gas to the gas channel 128. The stem portion 126 defines one or more gas slits 130 that direct gas radially outwardly from the gas channel 128 in a parallel direction relative to the upper surface 112 of the processing chamber 110.

A showerhead 144 includes a cylindrical base portion 146 and a stem portion 152. The cylindrical base portion 146 extends radially outwardly from the stem portion 152 to define a gap relative to the side walls 114. The cylindrical base portion 146 further defines a gas plenum 156. The stem portion 152 may have a hollow cylindrical shape that defines a cylindrical gas channel 157 that is in fluid communication with the gas plenum 156 of the cylindrical base portion 146. A gas dispersion plate 158 may be used to disperse gas flowing from the stem portion 152 to the cylindrical base portion 146. The showerhead 144 may further include a faceplate 160 defining a plurality of spaced through holes 162. The faceplate 160 disperses the process gas in a relatively uniform manner relative to a substrate 166 located on a substrate support 168 below the faceplate 160.

During operation, process gas is supplied through the gas channel 157 of the stem portion 152 into the gas plenum 156 of the cylindrical base portion 146. The gas flows out of the gas plenum 156 through the spaced through holes 162 of the faceplate 160. During some portions of the process, secondary purge gas may be supplied to the gas channel 128 of the collar 122. A portion of the secondary purge gas flows through the gas channel 128 and the gas slits 130 as can be seen at 169. The remainder of the secondary purge gas in the gas channel 128 flows downwardly toward the cylindrical base portion 146 and radially outwardly as can be seen at 170.

The secondary purge gas located between the cylindrical base portion 146 and the upper surface 112 of the processing chamber 110 flows through a gap between the cylindrical base portion 146 and the sidewalls 114 as can be seen at 174. At least some of the secondary purge gas is recirculated as can be seen at 172. As described above, the recirculating secondary purge gas may trap particles that may cause defects.

It is difficult to modulate velocity or flow of the secondary purge gas to prevent recirculation. Gas flow above the Peclet number prevents gases from the showerhead back diffusing to the backside of the showerhead (which is the function of the secondary purge gas). Without this effect, particles will reach the backside (whether there is recirculation or not).

Figure 3:
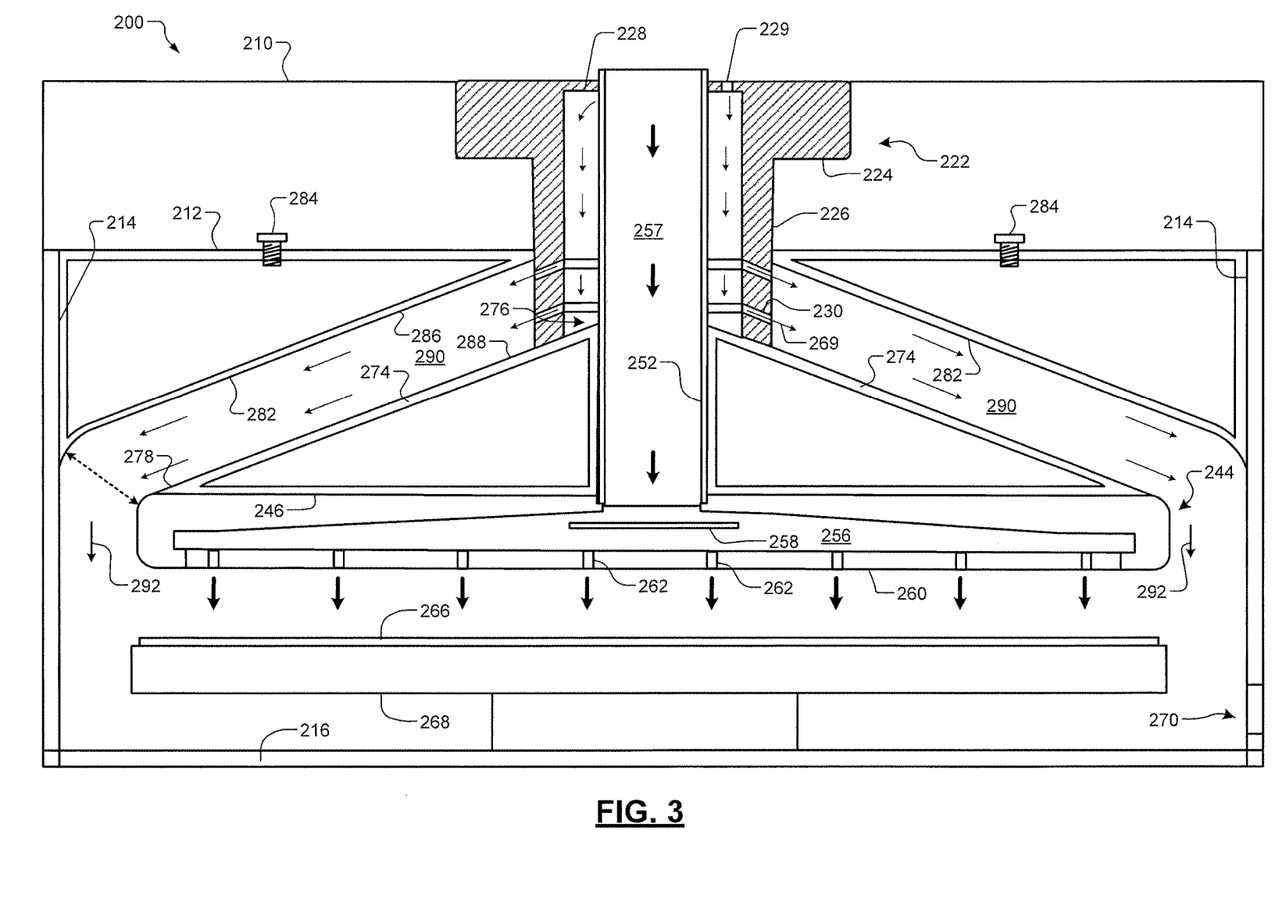
FIG. 3 is a side cross-sectional view of an example of a substrate processing system according to the present disclosure.

Referring now to FIG. 3, a substrate processing system 200 according to the present disclosure includes a processing chamber 210 with an upper surface 212, sidewalls 214 and a bottom surface 216. While a specific plasma processing chamber is shown, other processing chambers may be used. A collar 222 includes a base portion 224 and a stem portion 226. The collar 222 includes a radially outer surface and a radially inner surface. The radially inner surface defines a gas channel 228. In some examples, the gas channel 228 is annular shaped. An inlet 229 may be used to connect a gas source such as secondary purge gas to the gas channel 228. The stem portion 226 defines one or more gas slits 230 that direct gas from the gas channel 228 at a downward angle relative to a line parallel to the upper surface 212 of the processing chamber 210, as will be described further below. For example only, the gas slits 230 are spaced in a radial direction around the collar 222. For example only, the gas slits 230 are spaced in an axial direction along the collar 222.

A showerhead 244 includes a cylindrical base portion 246 and a stem portion 252. The cylindrical base portion 246 defines a gas plenum 256. The stem portion 252 may have a hollow cylindrical shape that defines a cylindrical gas channel 257 that is in fluid communication with the gas plenum 256 of the cylindrical base portion 246. A gas dispersion plate 258 may be used to disperse gas flowing from the stem portion 252 to the cylindrical base portion 246. The showerhead 244 may further include a faceplate 260 defining a plurality of spaced through holes 262. The faceplate 260 disperses the gas in a relatively uniform manner relative to a substrate 266 located below the faceplate 260 on a substrate support 268.

A conical surface 274 is arranged along a portion of the stem portion 252 and the cylindrical base portion 246. For example only, the conical surface 274 can be hollow (as shown) or solid. For example only, the conical surface 274 may be integrated with the showerhead 244 or a separate surface that is attached thereto (as shown). The conical surface 274 includes a central opening 276 for receiving the stem portion 252 of the collar 222. The conical surface 274 also includes a radially outer edge 278 that is arranged adjacent to and/or is connected to an upper surface of the cylindrical base portion 246.

An inverted conical surface 282 is arranged adjacent to and/or is connected to the upper surface 212 and/or the sidewalls 214 of the processing chamber 210. For example only, fasteners 284 may be used. For example only, the inverted conical surface 282 may be hollow or solid. For example only, the inverted conical surface 282 may be integrated with the top surface 212 and/or sidewalls 214 or a separate surface that is attached thereto (as shown). The conical surface 274 and the inverted conical surface 282 include facing surfaces 286 and 288, respectively, that define a flow channel 290. In some examples, the facing surfaces 286 and 288 of the flow channel 290 define a generally constant gap and are generally parallel. In other examples, an angle of the flow channel 290 defined by the facing surfaces 286 and 288 is approximately the same as an angle defined by the secondary purge gas flowing out of the gas slits 230.

During operation, process gas is supplied through the cylindrical gas channel 257 of the stem portion 252 into the gas plenum 256 of the cylindrical base portion 246. The gas flows out of the gas plenum 256 through the spaced through holes 262.

During some portions of the process, secondary purge gas may be supplied to the gas channel 228 of the collar 222. The secondary purge gas flows through the gas channel 228 and the gas slits 230 as can be seen at 269. The secondary purge gas in the flow channel 290 passes through a gap between the cylindrical base portion 246 and the sidewalls 214 as can be seen at 292. As can be seen, the arrangement in FIG. 3 ensures substantially laminar flow of the secondary purge gas, which reduces recirculation and defects.

In some examples, the conical surface 274 extends from a radially outer edge of the cylindrical base portion 246 to a radially outer edge of the stem portion 252 of the showerhead 244. In other examples, the conical surface 274 extends from a point near a radially outer edge of the cylindrical base portion 246 to a radially outer edge of the stem portion 252 of the showerhead 244. In other words, a gap may be created adjacent to the cylindrical base portion 246. In other examples, the conical surface 274 extends from a radially outer edge of the cylindrical base portion 246 to a point near a radially outer edge of the stem portion 252 of the showerhead 244. In other words, a gap may be created adjacent to the showerhead 244. In still other examples, gaps are created on both sides of the conical surface 274.

In some examples, the inverted conical surface 282 extends from the sidewalls 214 to a radially outer edge of the stem portion 226 of the collar 222. In some examples, the inverted conical surface 282 extends from a point near the sidewalls 214 to a radially outer edge of the stem portion 226 of the collar 222. In other words, a gap may be created between the inverted conical surface 282 and the sidewalls 214. In some examples, the inverted conical surface 282 extends from the sidewalls 214 to a point near a radially outer edge of the stem portion 226 of the collar 222. In other words, the gap may be created between the inverted conical surface 282 and the collar 222. In still other examples, gaps are created on both sides of the inverted conical surface 282.

Figure 4:
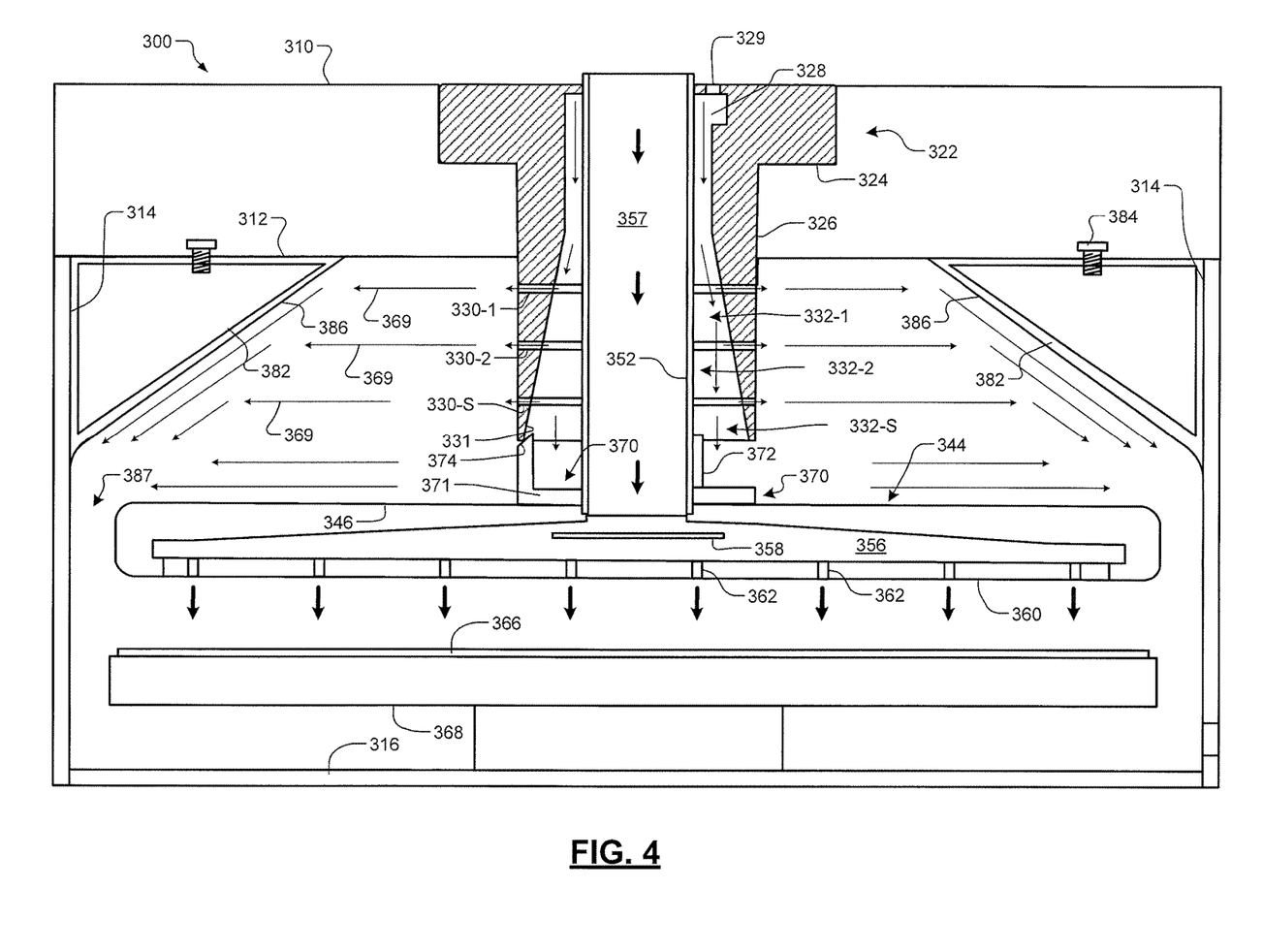
FIG. 4 is a side cross-sectional view of another example of a substrate processing system according to the present disclosure.

Referring now to FIG. 4, a substrate processing system 300 according to the present disclosure includes a processing chamber 310 with an upper surface 312, sidewalls 314 and a bottom surface 316. While a specific plasma processing chamber is shown, other processing chambers may be used.

A collar 322 includes a base portion 324 and a stem portion 326. The collar 322 includes a radially outer surface and a radially inner surface. The collar 322 defines a gas channel 328. In some examples, the gas channel 328 is annular shaped. An inlet 329 may be used to connect a gas source such as purge gas to the annular gas channel 328. The stem portion 326 defines one or more gas slits 330-1, 330-2, . . . , 330-S (collectively gas slits 330) that are arranged around the stem portion 326 that direct secondary purge gas through the collar 322 from the gas channel 328 into the processing chamber 310. The collar 322 may also define a lower opening to the gas channel 328. If used, the secondary purge gas also flows through the lower opening of the collar 322.

A showerhead 344 includes a cylindrical base portion 346 and a stem portion 352. The cylindrical base portion 346 defines a gas plenum 356. The stem portion 352 may have a hollow cylindrical shape that defines a gas channel 357 that is in fluid communication with the gas plenum 356 of the cylindrical base portion 346. A gas dispersion plate 358 may be used to disperse gas flowing from the stem portion 352 to the cylindrical base portion 346. The showerhead 344 may further include a faceplate 360 defining a plurality of spaced through holes 362. The faceplate 360 disperses the gas in a relatively uniform manner relative to a substrate 366 located below the faceplate 360 on a substrate support 368.

In some examples, the gas slits 330 on the stem portion 326 of the collar 322 direct gas from the gas channel 328 in a generally parallel direction relative to the upper surface 312 of the processing chamber 310. In some examples, an inner surface 331 of the stem portion 326 of the collar 322 has a monotonically increasing diameter as a vertical distance to the cylindrical base portion 346 decreases. The inner surface 331 defines a monotonically increasing gap between the collar 322 and the stem portion 352. In some examples, regions 332-1, 332-2, . . . 332-S bounded between adjacent ones of the gas slits 330, the stem portion 326 of the collar 322 and the stem portion 352 of the showerhead 344 are generally annular shaped with a trapezoidal cross-section. In some examples, radially inner angles of the trapezoidal cross-section are approximately right angles and radially outer surfaces of the regions 332 have a monotonically increasing diameter from top to bottom.

An inverted conical surface 382 is arranged adjacent to and/or is connected to the upper surface 312 of the processing chamber 310. For example only, fasteners 384 may be used. The inverted conical surface 382 includes an angled surface 386 that redirects horizontal gas flow in a downward direction. In some examples, the angled surfaces 386 are arranged at an acute angle relative to the flow from the gas slits 330. In some examples, the angled surfaces 386 are arranged at an angle between 30° and 60° relative to the flow from the gas slits 330. In some examples, the angled surfaces 386 are arranged at an angle between 40° and 50° relative to the flow from the gas slits 330. In some examples, a radially inner edge of the inverted conical surface 382 is spaced from the collar 322. In some examples, a bottom portion of a radially outer edge of the inverted conical surface 382 is located at or above an upper surface of the cylindrical base portion 346.

A spacer 370 may be provided to maintain a position of the collar 322 relative to the stem portion 352 of the showerhead 344. The spacer 370 may include an annular base portion 371 arranged around the stem portion 352 and resting on the cylindrical base portion 346. The spacer 370 further includes two or more arms 372 projecting upwardly from the annular base portion 371. An upper end of the arms 372 biases an inner surface of the stem portion 326 in an upward and outward direction.

During operation, process gas is supplied through the gas channel 357 of the stem portion 352 into the gas plenum 356 of the cylindrical base portion 346. The gas flows out of the gas plenum 356 through the spaced through holes 362.

During some portions of the process, secondary purge gas may be supplied to the gas channel 328 of the collar 322. The secondary purge gas flows through the gas channel 328 and the gas slits 330 as can be seen at 369. The gas flow 369 is redirected generally downwardly by the angled surfaces 386 of the inverted conical surface 382 towards a gap 387 between the showerhead 344 and the sidewalls 314. Other portions of the secondary purge gas flows downwardly out a bottom of the stem portion 326 and outwardly towards the sidewalls 314. As can be appreciated, the combination of the inverted conical surface 382 and the collar 322 reduce recirculation in an area above the showerhead 344.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a processing chamber;
a showerhead including a faceplate, a stem portion and a cylindrical base portion;
a collar connecting the showerhead to a top surface of the processing chamber,
wherein the collar defines a gas channel to receive secondary purge gas and a plurality of gas slits to direct the secondary purge gas from the gas channel in a radially outward and downward direction; and
a conical surface arranged adjacent to the cylindrical base portion and around the stem portion of the showerhead,
wherein a top surface of the processing chamber includes an inverted conical surface arranged adjacent to the top surface and sidewalls of the processing chamber, wherein the inverted conical surface extends radially outward from (i) the top surface adjacent to the collar to (ii) the sidewalls, and
wherein the conical surface and the inverted conical surface define an angled gas channel in a first gap between the conical surface and the inverted conical surface and extending radially outward from the collar to an outer edge of the cylindrical base portion and to the sidewalls of the processing chamber to define a second gap between a radially outer portion of the cylindrical base portion and the sidewalls of the processing chamber.

2. The substrate processing system of claim 1, wherein the gas channel defines a flow path that has a constant width and that is parallel to a direction of the secondary purge gas flowing from the plurality of gas slits.

3. The substrate processing system of claim 1, wherein the conical surface is hollow and is attached to at least one of the stem portion and the base portion of the showerhead.

4. The substrate processing system of claim 1, wherein the conical surface is solid and is attached to at least one of the stem portion and the base portion of the showerhead.

5. The substrate processing system of claim 1, wherein the conical surface is integrated with at least one of the stem portion and the base portion of the showerhead.

6. The substrate processing system of claim 1, wherein the inverted conical surface is hollow and is attached to at least one of the top surface and the sidewalls of the processing chamber.

7. The substrate processing system of claim 1, wherein the inverted conical surface is solid and is attached to at least one of the top surface and the sidewalls of the processing chamber.

8. The substrate processing system of claim 1, wherein the inverted conical surface is integrated with at least one of the top surface and the sidewalls of the processing chamber.

9. The substrate processing system of claim 1, wherein the conical surface includes a central opening for receiving the stem portion.

10. The substrate processing system of claim 1, wherein the plurality of gas slits are spaced in radial and axial directions along the collar.

* * * * *